United States Patent
Mastrocola

(10) Patent No.: US 9,814,169 B2
(45) Date of Patent: Nov. 7, 2017

(54) MOUNTING DEVICES

(71) Applicant: Hamilton Sundstrand Corporation, Charlotte, NC (US)

(72) Inventor: Naison E. Mastrocola, Goshen, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 14/829,068

(22) Filed: Aug. 18, 2015

(65) Prior Publication Data

US 2017/0055382 A1  Feb. 23, 2017

(51) Int. Cl.
G06F 1/16 (2006.01)
H05K 5/00 (2006.01)
H05K 7/00 (2006.01)
H05K 13/04 (2006.01)
H05K 7/14 (2006.01)

(52) U.S. Cl.
CPC ........... *H05K 13/04* (2013.01); *H05K 7/1404* (2013.01)

(58) Field of Classification Search
CPC .... H05K 13/04; H05K 7/1402; H05K 7/1404; H05K 7/1407; H05K 7/1408; H05K 7/1409
USPC .... 361/679.58, 679.59, 679.31, 679.32, 704, 361/719, 721; 403/373–374.5
See application file for complete search history.

(56) References Cited

U.S. PATENT DOCUMENTS

| 3,194,467 A | 7/1965 | Goonan et al. |
| 4,354,770 A | 10/1982 | Block |
| 4,480,287 A * | 10/1984 | Jensen ................ H05K 7/1404 361/707 |
| 5,036,428 A | 7/1991 | Brownhill et al. |
| 5,211,496 A | 5/1993 | Hurowitz |
| 5,224,016 A | 6/1993 | Weisman et al. |
| 5,290,122 A * | 3/1994 | Hulme ................ H05K 7/1404 165/80.2 |
| 6,615,997 B2 * | 9/2003 | Danello ............... H01R 4/5016 211/26 |

(Continued)

FOREIGN PATENT DOCUMENTS

DE  1953363 A1  5/1971

OTHER PUBLICATIONS

Extended European Search Report, issued in corresponding European Patent Application No. EP 16183994.9, dated Mar. 21, 2017.

*Primary Examiner* — Anthony Haughton
(74) *Attorney, Agent, or Firm* — Locke Lord LLP; Scott D. Wofsy; Joshua L. Jones

(57) ABSTRACT

An apparatus for mounting electronic components includes a linear actuator defining a longitudinal axis. A driver member is engaged to the linear actuator for motion along the longitudinal axis. The driver member defines a mounting plane and includes a wedge surface that is oblique facing in a direction that has a component towards the mounting plane and a component away from the longitudinal axis in a direction parallel to the mounting plane. A locking wedge is engaged with the wedge surface of the driver member to be driven both toward the mounting plane and lateral to the mounting plane away from the longitudinal axis by sliding along the wedge surface of the driver member with the actuator driving the drive member toward a center of the locking wedge.

15 Claims, 4 Drawing Sheets

(56) References Cited

U.S. PATENT DOCUMENTS

| | | | |
|---|---|---|---|
| 6,695,524 B2* | 2/2004 | Monson | F16B 2/04 |
| | | | 248/231.31 |
| 7,322,843 B1 | 1/2008 | Lee et al. | |
| 7,483,271 B2* | 1/2009 | Miller | H05K 7/1404 |
| | | | 165/80.2 |
| 8,045,332 B2 | 10/2011 | Lee et al. | |
| 2012/0087089 A1 | 4/2012 | Monson et al. | |

* cited by examiner

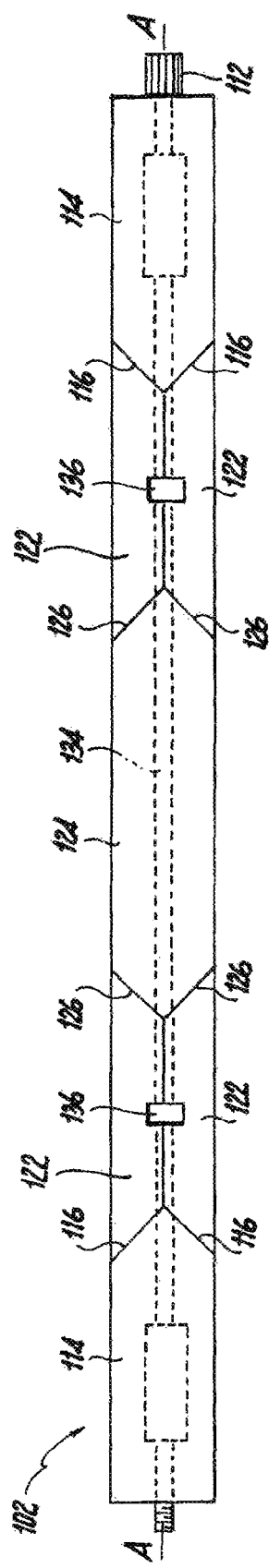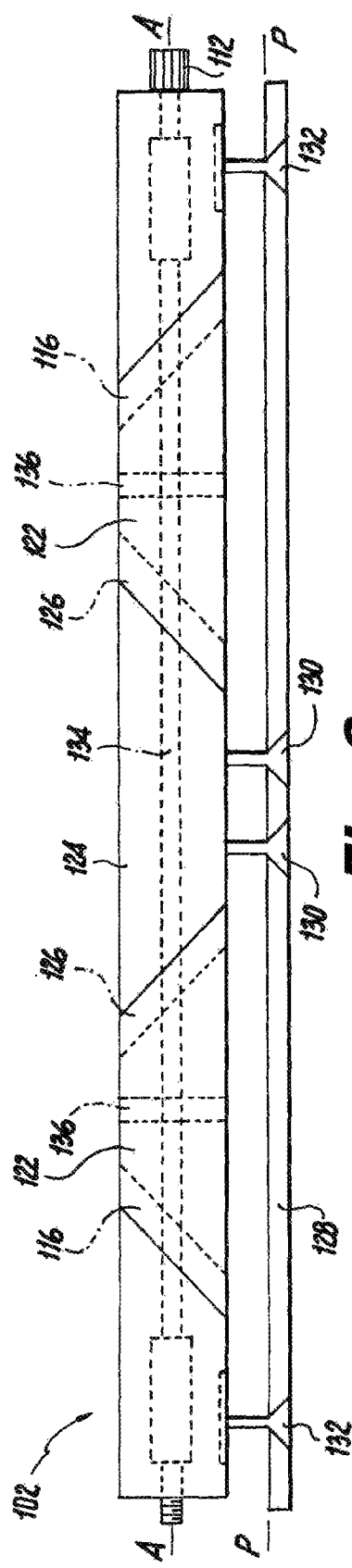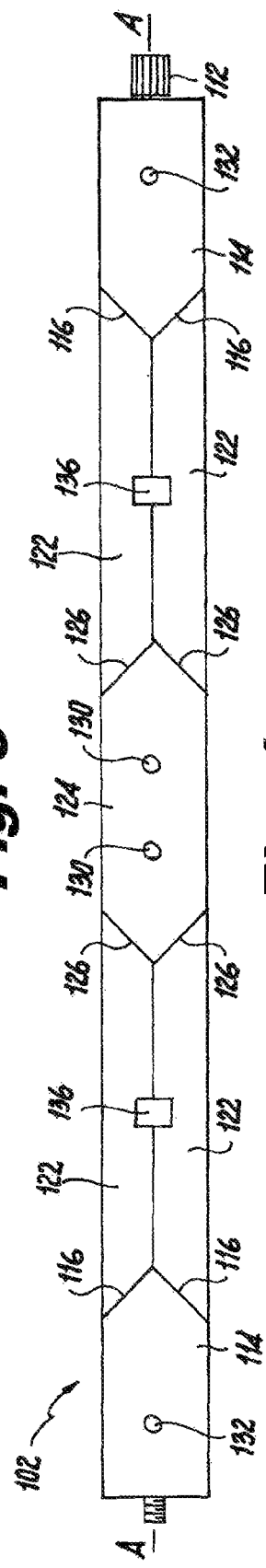

MOUNTING DEVICES

BACKGROUND OF THE INVENTION

1. Field of the Invention

The present disclosure relates to board mounting devices, and more particularly to wedge assemblies such as used in mounting circuit cards or the like.

2. Description of Related Art

A variety of devices and methods are known in the art for removably mounting electronic components such as circuit cart assemblies into computing devices such as mother boards, cases, line replaceable units (LRU's), or the like. Of such devices, many are directed to wedges or clamps that squeeze against the board or card to keep it in place. An operator can release the pressure on the wedges or clamps to remove the board or card when desired.

Such conventional methods and systems have generally been considered satisfactory for their intended purpose. However, there is still a need in the art for improved mounting devices. The present disclosure provides a solution for this need.

SUMMARY OF THE INVENTION

An apparatus for mounting electronic components includes a linear actuator defining a longitudinal axis. A driver member is engaged to the linear actuator for motion along the longitudinal axis. The driver member defines a mounting plane and includes a wedge surface that is oblique facing in a direction that has a component towards the mounting plane and a component away from the longitudinal axis in a direction parallel to the mounting plane. A locking wedge is engaged with the wedge surface of the driver member to be driven both toward the mounting plane and lateral to the mounting plane away from the longitudinal axis by sliding along the wedge surface of the driver member with the actuator driving the drive member toward a center of the locking wedge.

A base member can be included opposite the driver member across the locking wedge along the longitudinal axis. The base member can include a wedge surface symmetrical with the wedge surface of the driver member across the center of the locking wedge. The locking wedge can engage the wedge surface of the base member to be driven outward from the longitudinal axis and toward the mounting plane as the linear actuator drives the driver member toward the base member. A chassis can be included, wherein the base member is mounted stationary relative to the chassis, and wherein the driver member is mounted for longitudinal movement relative to the chassis.

The locking wedge can be a first locking wedge, and a second locking wedge can be mounted back to back with the first locking wedge across the longitudinal axis, wherein the wedge surface of the driver member is a first wedge surface, wherein the driver member has a second wedge surface symmetrical with the first wedge surface across the longitudinal axis, wherein the second locking wedge is engaged with the second wedge surface of the driver member be driven both toward the mounting plane and lateral to the mounting plane away from the first mounting wedge. A biasing member can be engaged to bias the first and second locking wedges together. A base member can be included opposite the driver member across the first and second locking wedges along the longitudinal axis, wherein the base member includes respective first and second wedge surfaces symmetrical with the wedge surfaces of the driver member across the center of the locking wedge, wherein the first and second locking wedge engage the wedge surfaces of the base member to be driven outward from the longitudinal axis and toward the mounting plane as the linear actuator drives the driver member toward the base member.

It is also contemplated that the driver member and the first and second locking wedges as described above can be a first clamping group engaged with a base member, and that a second clamping group can be engaged with the base member, wherein the second clamping group is substantially symmetric with the first clamping group across the base member. Each locking wedge can be operatively connected to the driver member for actuation between a retracted position proximate the longitudinal axis and an extended position spaced apart from the longitudinal axis and proximate the mounting plane.

Each locking wedge can be operatively connected to the driver member for actuation between a retracted position proximate the longitudinal axis, spaced apart from the chassis, and an extended position spaced apart from the longitudinal axis and in thermal communication with the chassis for conduction of heat through the locking wedge to the chassis. A circuit card assembly can be pinched between the locking wedge and a shoulder portion of the chassis, wherein the locking wedge is in thermal communication with a base portion of the chassis for conduction of heat from the circuit card assembly through the locking wedge to the chassis. For example, in certain embodiments, first and second circuit card assemblies can be included, the first circuit card assembly being pinched between the first locking wedge and a shoulder portion of the chassis, the second circuit card assembly being pinched between the second locking wedge and a shoulder portion of the chassis, wherein each of the first and second locking wedges is in thermal communication with a base portion of the chassis for conduction of heat from the respective circuit card assembly to the chassis.

The linear actuator, driver member, locking wedge, and base member as described above can be a first dual wedge assembly, and a second such dual wedge assembly can be mounted to the chassis opposite the first dual wedge assembly across the circuit card assembly, wherein the circuit card assembly is pinched between a locking wedge of the second dual wedge assembly and a shoulder portion of the chassis, and wherein the locking wedge of the second circuit card assembly is in thermal communication with a base portion of the chassis for conduction of heat from the circuit card assembly to the chassis.

The linear actuator can include a threaded rod, wherein each driver member is threaded to the threaded rod for linear actuation with rotary motion of the threaded rod. The driver member of a first clamping group as described above can be threaded to the threaded rod with threads in a first thread direction, and wherein the driver member of the second clamping group as described above can be threaded to the threaded rod with threads in a direction opposite the first thread direction for actuation of the driver members in opposite axial directions.

The linear actuator, driver member, first and second locking wedges, and base member as described above can be a first dual wedge assembly, and a second such dual wedge assembly can be mounted to the chassis opposite the first dual wedge assembly across the circuit card assembly, wherein the circuit card assemblies are pinched between respective locking wedges of the second dual wedge assembly and respective shoulder portions of the chassis, and wherein the locking wedges of the second circuit card assembly is in thermal communication with a base portion of the chassis for conduction of heat from the circuit card assemblies to the chassis.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 2 is a top plan view of a portion of the apparatus of FIG. 1, showing the locking wedges in a retracted position;

FIG. 3 is a side elevation view of the apparatus of FIG. 2, showing the dual wedge assembly mounted to the chassis;

FIG. 4 is a bottom plan view of the apparatus of FIG. 2, showing the locking wedges in a retracted position;

DETAILED DESCRIPTION OF THE PREFERRED EMBODIMENTS

Figure 1:
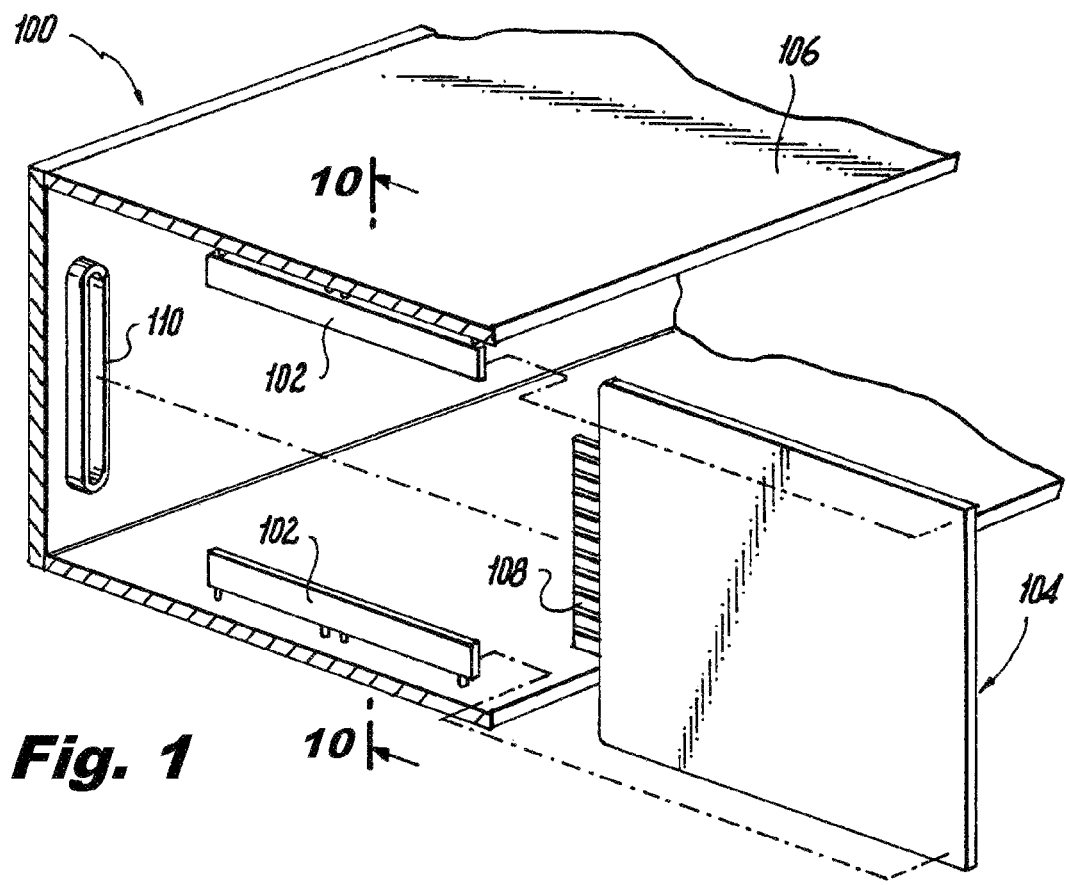
FIG. 1 is a schematic perspective view of an exemplary embodiment of an apparatus for mounting electronic components constructed in accordance with the present disclosure, showing a circuit card assembly to be mounted in a line replaceable unit (LRU)

Reference will now be made to the drawings wherein like reference numerals identify similar structural features or aspects of the subject disclosure. For purposes of explanation and illustration, and not limitation, a partial view of an exemplary embodiment of an apparatus in accordance with the disclosure is shown in FIG. 1 and is designated generally by reference character 100. Other embodiments of the apparatus in accordance with the disclosure, or aspects thereof, are provided in FIGS. 2-10, as will be described. The systems and methods described herein can be used to mount circuit card assemblies in place, for example in line-replaceable units (LRU's) and the like.

Figure 10:
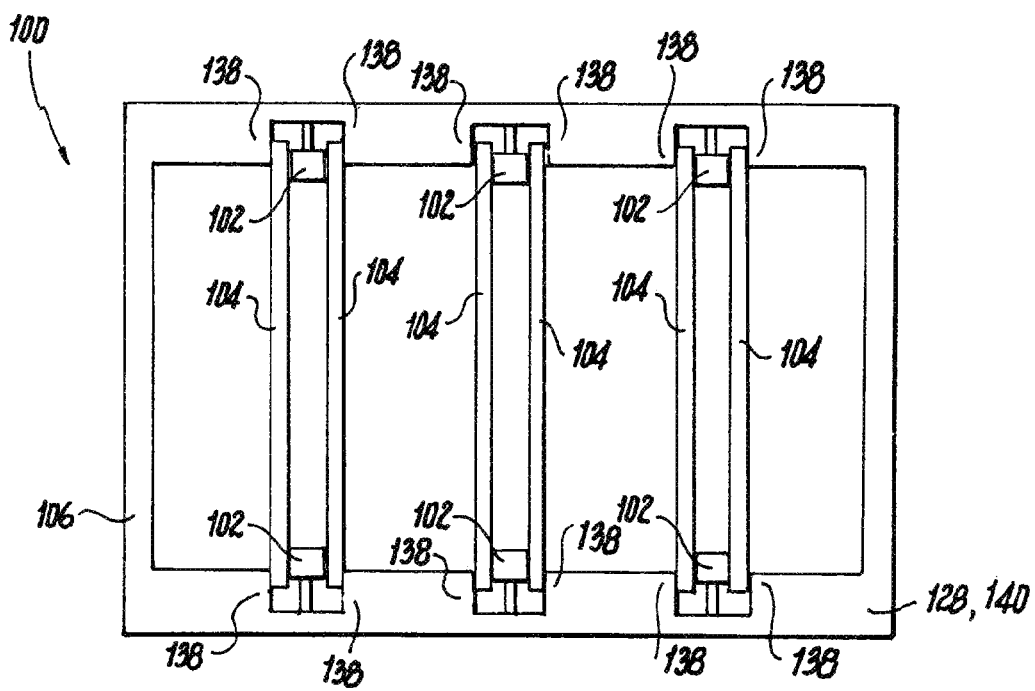
FIG. 10 is a schematic cross-sectional end view of the apparatus of FIG. 1, showing multiple dual wedge assemblies mounting multiple circuit card assemblies within the LRU.

Apparatus 100 includes dual wedge assembly 102 for mounting circuit card assembly (CCA) 104 in place within LRU 106 so that the connector end 108 of CCA 104 can electrically connect with back plane connector 110 of LRU 106. As shown in FIG. 10, LRU 106 includes multiple dual wedge assemblies 102, in opposed pairs, here each pair of dual wedge assemblies 102 mounts two CCA's 104 to LRU 106. The CCA's. 104 in this arrangement are mechanically secure, so apparatus 100 can ensure uninterrupted operation of CCA's 104 and LRU 106 even in applications such as aviation where there are dynamic mechanical loads impacting apparatus 100. Those skilled in the art will readily appreciate that the number of CCA's and dual wedge assemblies 102 shown in FIG. 10 is exemplary, and that any other suitable numbers can be used. It will also be readily appreciated that LRU's and CCA's are an exemplary application, and that any suitable type of circuit cards can be mounted to any suitable type of computer assembly without departing from the scope of this disclosure.

With reference now to FIG. 2, dual wedge assembly 102 includes a linear actuator 112 defining a longitudinal axis A. An opposed pair of driver members 114 is engaged to the linear actuator 112 for motion along the longitudinal axis A. Driver members 114 define a mounting plane P, identified in FIG. 3, and each driver member 116 includes a pair of wedge surfaces 116, FIG. 4 shows dual wedge assembly 102 as viewed toward mounting plane P.

Figure 5:
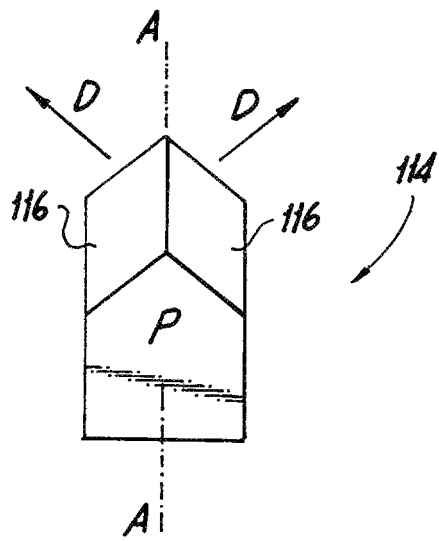
FIG. 5 is a bottom plan view of a portion of the apparatus of FIG. 2, showing one of the driver members.
Figure 6:
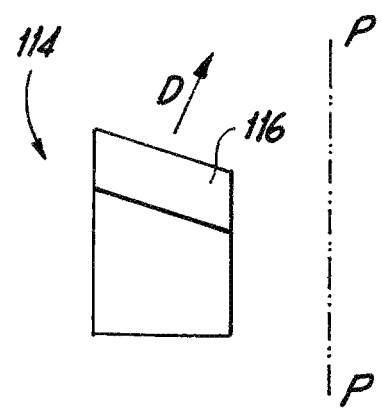
FIG. 6 is a side elevation view of a the driver member of FIG. 5, showing one of the wedge surfaces.
Figure 7:
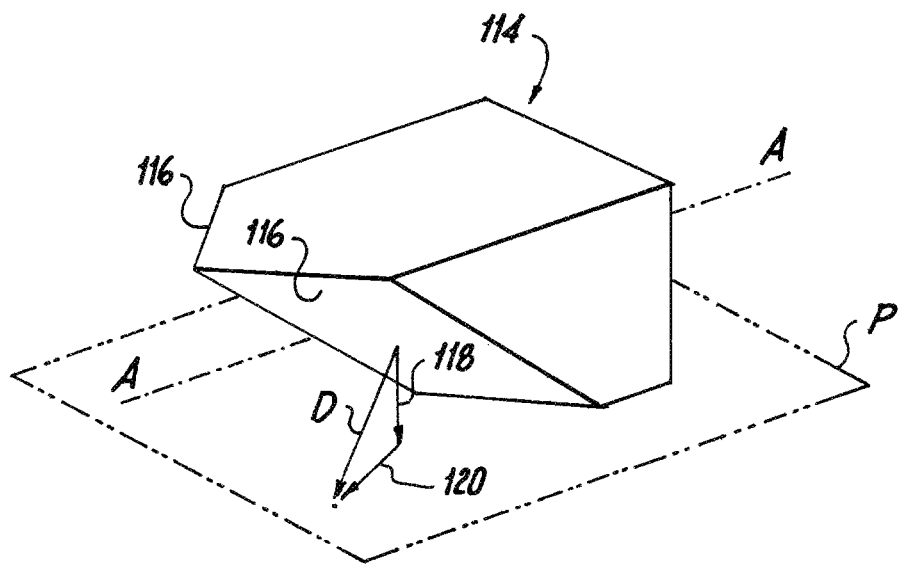
FIG. 7 is a schematic perspective view of the driver member of FIG. 5, showing the two components of the direction of the wedge surface relative to the longitudinal axis and mounting plane.

Each wedge surface 116 is oblique facing in a direction D that has a component 118 towards the mounting plane P, as indicated by the arrow in FIG. 6, and a component 120 away from the longitudinal axis A in a direction parallel to the mounting plane P, as indicated by the two arrows in FIG. 5. FIG. 7 shows components 118 and 120 of direction D relative to mounting plane P and longitudinal axis A. Those skilled in the art will readily appreciate that component 120 can be further broken down into a component parallel to longitudinal axis A, and a component perpendicular to the direction of longitudinal axis A.

Figure 8:
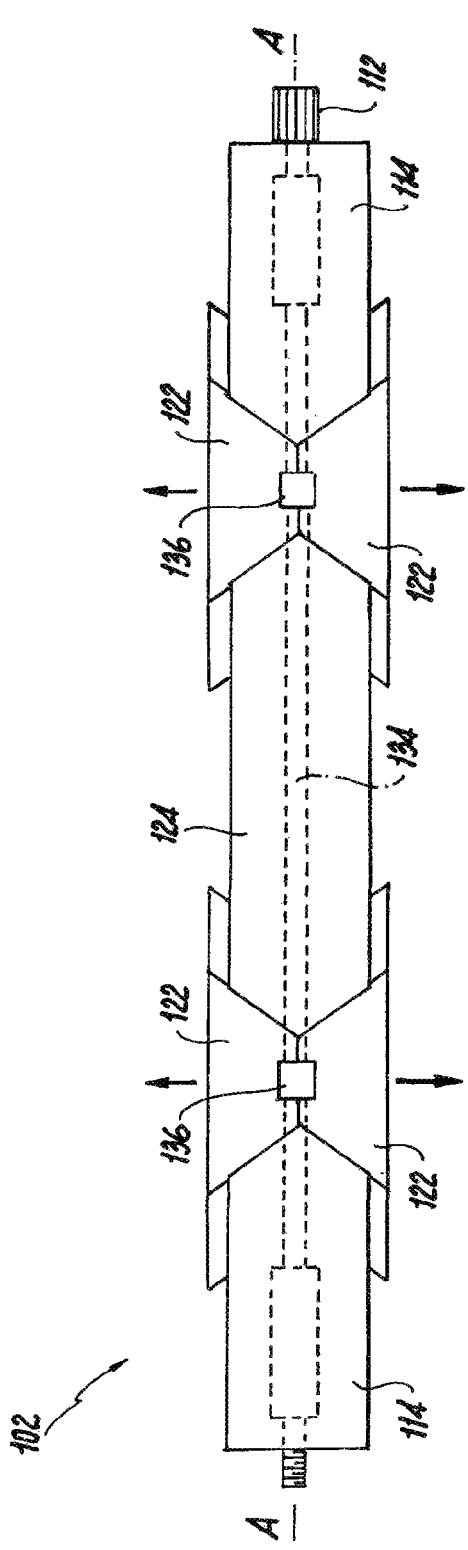
FIG. 8 is a top plan view of a portion of the apparatus of FIG. 2, showing the locking wedges in an extended position.
Figure 9:
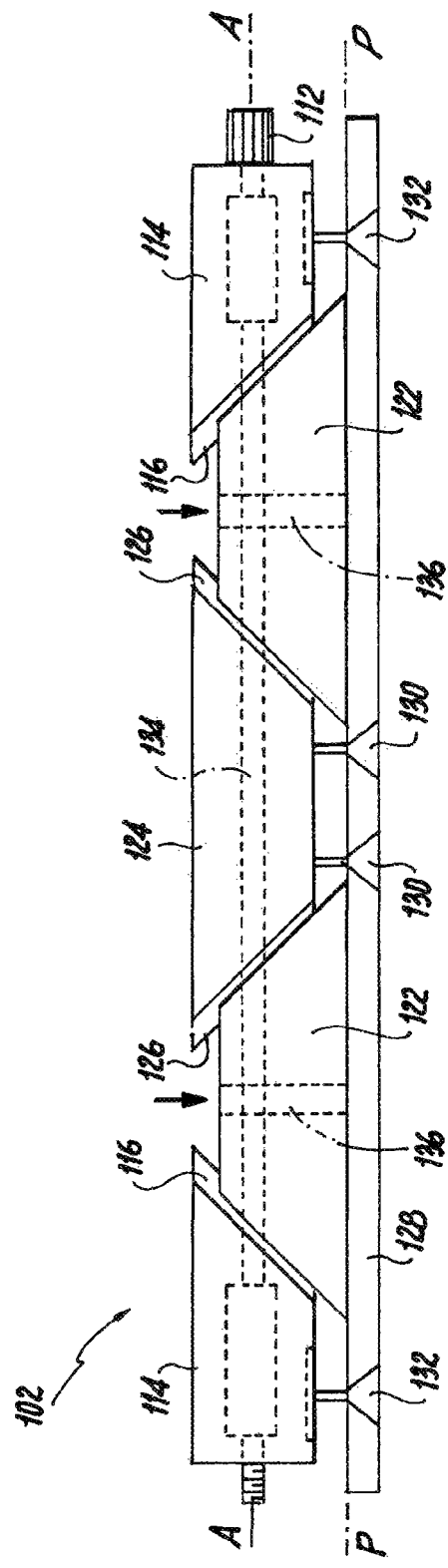
FIG. 9 is a side elevation view of the apparatus of FIG. 3, showing the locking wedges in the extended position.

With reference again to FIGS. 24, a respective wedge surface of locking wedge 122 is engaged with each of the respective wedge surfaces 116 of the driver members 114 to be driven both toward the mounting plane P and lateral to the mounting plane P away from the longitudinal axis A by sliding along the respective wedge surfaces 116 of the driver members 114 with the actuator 112 driving the driver members 114 toward a centers of the locking wedges 122. The components 118 and 120 of direction D of wedge surfaces 116 allow driver members 114 to provide for this motion both away from axis A and toward mounting plane P. FIGS. 2 and 3 show locking wedges 122 in the retracted position, in which a CCA 104 can be inserted into LRU 106, and FIGS. 8 and 9, respectively, show the same views of dual wedge assembly 102, but with the locking wedges 122 in the extended position, as indicated by the large arrows in FIGS. 8 and 9, to lock CCA's in place within LRU 106. FIG. 8 shows how the locking wedges 122 move away from longitudinal axis A, and FIG. 9 shows how the locking wedges 122 also move towards mounting plane P, i.e., the centers of locking wedges 122 move closer to mounting plane P.

A base member 124 is included opposite each of the driver members 114 across the respective locking wedges 122 along the longitudinal axis A. Base member 124 includes a pair of wedge surfaces 126 that are symmetrical with the wedge surfaces 116 of the respective driver members 114 across the center of the respective locking wedges 122. Each locking wedge 122 has a respective wedge surface that engages a respective wedge surface 126 of base member 124 to be driven outward from the longitudinal axis A and toward the mounting plane P as linear actuator 112 drives the respective driver member 114 toward base member 124. As shown in FIGS. 3 and 9, a chassis 128 of LRU 106 is included, along mounting plane P, wherein base member 124 is mounted to chassis 128 to be stationary relative to chassis 128, e.g. by pins 130, and wherein the driver members 114 are mounted to chassis 128 for longitudinal movement relative to the chassis 128, e.g., by sliding pins 132.

Each respective set of driver members 114 and locking wedges 122 forms a clamping group, and each dual wedge assembly 102 includes a substantially symmetrical pair of clamping groups opposed to one another across the base member 124. Linear actuator 112 includes a threaded rod 134, wherein each driver member 114 is threaded to threaded rod 134 for linear actuation with rotary motion of the threaded rod 134. The driver member 114 of a first one of the clamping groups as described above is threaded to the threaded rod 134 with threads in a first thread direction, and wherein the driver member 114 of the second clamping group as described above can be threaded to the threaded rod 134 with threads in a direction opposite the first thread direction for actuation of the driver members 114 in opposite axial directions. When actuated from the retracted position to the extended position of the locking wedges 122, driver members 114 move towards each other and towards base member 124, as shown in FIGS. 8 and 9.

Each locking wedge 122 is mounted back to back with another locking wedge 122 across the longitudinal axis A to be driven laterally to the mounting plane P away from its back to back mounting wedge 122. A biasing member 136, e.g. of a resilient material, is engaged to bias each back to back pair of locking wedges 122 together. Each locking wedge 122 can be driven into the extended position shown in FIG. 9 where each locking wedge 122 is in thermal communication with the chassis 128 for conduction of heat through the respective locking wedge 122 to the chassis 128. Those Skilled in the art will readily appreciate that the number of locking wedges 122 included, e.g., four locking wedges 122 as shown in FIG. 2, can be any suitable number without departing from the scope of this disclosure. For example, a dual wedge assembly can include a single pair of back to back locking wedges 122, or three or more pairs of back to back locking wedges 122 as suitable for a given application, depending on the length of the dual wedge assembly. Those skilled in the art will also readily appreciate that it is possible to have single locking wedges instead of back to back locking wedges 122, where it is only desired to mount a single CCA 104 with a wedge assembly.

With reference now to FIG. 10, each circuit card assembly 104 can be pinched between a respective set of locking wedges 122 and a shoulder portion 138 of chassis 128, so that the locking wedges 122 are in thermal communication with a base portion 140 of the chassis 128 for conduction of heat from the CCA's 104 through the locking wedges 122 to the chassis 128.

The methods and systems of the present disclosure, as described above and shown in the drawings, provide apparatuses for mounting circuit card assemblies and the like with superior properties including improved engagement and heat transfer. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An apparatus for mounting electronic components comprising:
    a linear actuator defining a longitudinal axis;
    a driver member engaged to the linear actuator for motion along the longitudinal axis, wherein the driver member defines a mounting plane and includes a wedge surface that is oblique facing in a direction that has a component in a first direction towards the mounting plane and a component away from the longitudinal axis in a second direction parallel to the mounting plane, wherein the first and second directions are different from one another; and
    a locking wedge engaged with the wedge surface of the driver member to be driven both toward the mounting plane and lateral to the mounting plane away from the longitudinal axis by sliding along the wedge surface of the driver member with the actuator driving the drive member toward a center of the locking wedge.

2. The apparatus as recited in claim 1, further comprising:
    a base member opposite the driver member across the locking wedge along the longitudinal axis, wherein the base member includes a wedge surface symmetrical with the wedge surface of the driver member across the center of the locking wedge, wherein the locking wedge engages the wedge surface of the base member to be driven outward from the longitudinal axis and toward the mounting plane as the linear actuator drives the driver member toward the base member.

3. The apparatus as recited in claim 2, further comprising a chassis, wherein the base member is mounted stationary relative to the chassis, and wherein the driver member is mounted for longitudinal movement relative to the chassis.

4. The apparatus as recited in claim 1, wherein the locking wedge is a first locking wedge, and further comprising a second locking wedge mounted back to back with the first locking wedge across the longitudinal axis, wherein the wedge surface of the driver member is a first wedge surface, wherein the driver member has a second wedge surface symmetrical with the first wedge surface across the longitudinal axis, wherein the second locking wedge is engaged with the second wedge surface of the driver member to be driven both toward the mounting plane and lateral to the mounting plane away from the first mounting wedge.

5. The apparatus as recited in claim 4, further comprising a biasing member engaged to bias the first and second locking wedges together.

6. The apparatus as recited in claim 4, further comprising:
    a base member opposite the driver member across the first and second locking wedges along the longitudinal axis, wherein the base member includes respective first and second wedge surfaces symmetrical with the wedge surfaces of the driver member across the center of the locking wedge, wherein the first and second locking wedge engage the wedge surfaces of the base member to be driven outward from the longitudinal axis and toward the mounting plane as the linear actuator drives the driver member toward the base member.

7. The apparatus as recited in claim 6, wherein the driver member and the first and second locking wedges are a first clamping group engaged with a base member, and further comprising a second clamping group engaged with the base member, wherein the second clamping group is substantially symmetric with the first clamping group across the base member.

8. The apparatus as recited in claim 1, wherein each locking wedge is operatively connected to the driver member for actuation between a retracted position proximate the longitudinal axis and an extended position spaced apart from the longitudinal axis and proximate the mounting plane.

9. The apparatus as recited in claim 3, wherein each locking wedge is operatively connected to the driver member for actuation between a retracted position proximate the longitudinal axis, spaced apart from the chassis, and an extended position spaced apart from the longitudinal axis and in thermal communication with the chassis for conduction of heat through the locking wedge to the chassis.

10. The apparatus as recited in claim 1, wherein the linear actuator includes a threaded rod, wherein each driver member is threaded to the threaded rod for linear actuation with rotary motion of the threaded rod.

11. The apparatus as recited in claim 7, wherein the linear actuator includes a threaded rod, wherein the driver member of the first clamping group is threaded to the threaded rod with threads in a first thread direction, and wherein the driver member of the second clamping group is threaded to the threaded rod with threads in a direction opposite the first thread direction for actuation of the driver members in opposite axial directions.

12. The apparatus as recited in claim 3, further comprising a circuit card assembly pinched between the locking wedge and a shoulder portion of the chassis, wherein the locking wedge is in thermal communication with a base portion of the chassis for conduction of heat from the circuit card assembly through the locking wedge to the chassis.

13. The apparatus as recited in claim 12, wherein the linear actuator, driver member, locking wedge, and base member are a first dual wedge assembly, and further comprising a second such dual wedge assembly mounted to the chassis opposite the first dual wedge assembly across the circuit card assembly, wherein the circuit card assembly is pinched between a locking wedge of the second dual wedge assembly and a shoulder portion of the chassis, and wherein the locking wedge of the second circuit card assembly is in thermal communication with a base portion of the chassis for conduction of heat from the circuit card assembly to the chassis.

14. The apparatus as recited in claim 4, further comprising first and second circuit card assemblies, the first circuit card assembly being pinched between the first locking wedge and a shoulder portion of the chassis, the second circuit card assembly being pinched between the second locking wedge and a shoulder portion of the chassis, wherein each of the first and second locking wedges is in thermal communication with a base portion of the chassis for conduction of heat from the respective circuit card assembly to the chassis.

15. The apparatus recited in claim 14, wherein the linear actuator, driver member, first and second locking wedges, and base member are a first dual wedge assembly, and further comprising a second such dual wedge assembly mounted to the chassis opposite the first dual wedge assembly across the circuit card assembly, wherein the circuit card assemblies are pinched between respective locking wedges of the second dual wedge assembly and respective shoulder portions of the chassis, and wherein the locking wedges of the second circuit card assembly is in thermal communication with a base portion of the chassis for conduction of heat from the circuit card assemblies to the chassis.

* * * * *